United States Patent
Choi et al.

(10) Patent No.: US 12,531,518 B2
(45) Date of Patent: Jan. 20, 2026

(54) OVERDRIVE PROTECTION CIRCUIT WITH FAST RECOVERY

(71) Applicant: Skyworks Solutions, Inc., Irvine, CA (US)

(72) Inventors: Yeung Bun Choi, Singapore (SG); David Steven Ripley, Cedar Rapids, IA (US); Peng Sun, Singapore (SG)

(73) Assignee: Skyworks Solutions, Inc., Irvine, CA (US)

( * ) Notice: Subject to any disclaimer, the term of this patent is extended or adjusted under 35 U.S.C. 154(b) by 626 days.

(21) Appl. No.: 17/956,635

(22) Filed: Sep. 29, 2022

(65) Prior Publication Data

US 2023/0108810 A1    Apr. 6, 2023

Related U.S. Application Data

(60) Provisional application No. 63/251,497, filed on Oct. 1, 2021.

(51) Int. Cl.
*H03F 1/52* (2006.01)
*H03F 3/24* (2006.01)
*H04B 1/04* (2006.01)

(52) U.S. Cl.
CPC .......... *H03F 1/52* (2013.01); *H03F 3/245* (2013.01); *H03F 2200/171* (2013.01); *H03F 2200/426* (2013.01); *H03F 2200/451* (2013.01); *H04B 1/04* (2013.01); *H04B 2001/045* (2013.01)

(58) Field of Classification Search
CPC ...... H03F 1/52; H03F 3/245; H03F 2200/171; H03F 2200/426; H03F 2200/451; H03F 3/195; H04B 1/04; H04B 2001/045

USPC .......................................................... 330/298
See application file for complete search history.

(56) References Cited

U.S. PATENT DOCUMENTS

| | | |
|---|---|---|
| 4,945,445 A | 7/1990 | Schmerda et al. |
| 6,150,714 A | 11/2000 | Andreycak et al. |
| 6,229,389 B1 * | 5/2001 | Pullen .................. H03F 3/2171 330/10 |
| 6,424,035 B1 | 7/2002 | Sapp et al. |
| 7,054,605 B1 | 5/2006 | Groe |
| 7,515,000 B1 | 4/2009 | Jin et al. |
| 8,154,345 B2 | 4/2012 | Andrys et al. |

(Continued)

FOREIGN PATENT DOCUMENTS

WO    WO 2011/152921 A2    12/2011

*Primary Examiner* — Andrea Lindgren Baltzell
*Assistant Examiner* — Khiem D Nguyen
(74) *Attorney, Agent, or Firm* — Knobbe, Martens, Olson & Bear, LLP

(57) ABSTRACT

An amplifier circuit comprising a power amplifier and a protection circuit coupled to the power amplifier. The protection circuit is configured to detect an overdrive condition and, in response to detecting an overdrive condition, apply a clamping status to the protection circuit to reduce a bias current to the power amplifier. The protection circuit has a capacitor and a recovery circuit including: a sensing component configured to monitor a change of charging and discharging currents to and from the capacitor respectively during the clamping status; a first device configured to set a time constant of the recovery circuit; and a second device configured to reset the protection circuit to remove the clamping status when the change of charging or discharging current is beyond a predetermined threshold.

20 Claims, 8 Drawing Sheets

(56) References Cited

U.S. PATENT DOCUMENTS

| | | |
|---|---|---|
| 8,362,840 B2 | 1/2013 | Andrys |
| 9,595,926 B2 | 3/2017 | Quaglietta |
| 9,853,613 B2 | 12/2017 | Quaglietta |
| 2004/0185814 A1 | 9/2004 | Inamori et al. |
| 2007/0216485 A1 | 9/2007 | Fuji et al. |
| 2008/0197928 A1 | 8/2008 | Watson |
| 2009/0058525 A1 | 3/2009 | Damitio et al. |
| 2009/0102493 A1 | 4/2009 | Disney et al. |
| 2011/0291765 A1 | 12/2011 | Sun et al. |
| 2011/0292554 A1 | 12/2011 | Yao et al. |
| 2011/0298538 A1 | 12/2011 | Andrys |
| 2012/0187930 A1 | 7/2012 | Williams et al. |
| 2013/0300507 A1 | 11/2013 | Sutardja et al. |
| 2014/0197892 A1 | 7/2014 | Gorbachiv |
| 2014/0266470 A1 | 9/2014 | Maxim et al. |
| 2015/0256138 A1 | 9/2015 | Dasgupta |
| 2016/0036395 A1 | 2/2016 | Quaglietta |
| 2016/0241143 A1 | 8/2016 | Ng et al. |

\* cited by examiner

OVERDRIVE PROTECTION CIRCUIT WITH FAST RECOVERY

BACKGROUND

Any and all applications for which a foreign or domestic priority claim is identified in the Application Data Sheet as filed with the present application are hereby incorporated by reference under 37 C.F.R. § 1.57.

FIELD

Embodiments of the disclosure relate to an amplifier circuit, and in particular to an amplifier circuit having a protection circuit and a fast recovery circuit. Embodiments of the disclosure also relate to a radio-frequency module, a wireless communication device, and a method for protecting an amplifier circuit.

DESCRIPTION OF THE RELATED TECHNOLOGY

Modern power amplifier (PA) modules typically require an overdrive protection loop to clamp average transient power, so that the devices such as temperature compensated surface acoustic wave (TC-SAW) filters and bulk acoustic wave (BAW) filters coupled to the power amplifier modules won't be damaged. Such protection loops typically include a large time constant filter (in the order of a millisecond) to detect the average power instead of instantaneous power.

SUMMARY

According to one embodiment, there is provided an amplifier circuit comprising: a power amplifier; and a protection circuit coupled to the power amplifier, the protection circuit being configured to detect an overdrive condition and, in response to detecting an overdrive condition, apply a clamping status to the protection circuit to reduce a bias current to the power amplifier, the protection circuit having a capacitor and a recovery circuit including: a sensing component configured to monitor a change of charging and discharging currents to and from the capacitor respectively during the clamping status; a first device configured to set a time constant of the recovery circuit; and a second device configured to reset the protection circuit to remove the clamping status when the change of charging or discharging current is beyond a predetermined threshold.

In one example, the capacitor may be configured to charge when a load bias sensing current is above a predetermined threshold, indicating the overdrive condition.

In one example, the protection circuit may further comprise a transconductance device driven by a voltage over the capacitor and being configured to reduce the bias current to the power amplifier during the clamping status.

In one example, the sensing component may be configured to monitor the change of charging and discharging currents to and from the capacitor respectively by observing a voltage drop across sensing terminals of the sensing component.

In one example, the sensing component may be a sensing resistor.

In one example, the first device may be a filter device configured to filter the voltage across the sensing component.

In one example, the second device may be a comparator device. The comparator device may be an adaptive threshold comparator device. The comparator device may be configured to receive an auto-zeroing control signal.

In one example, the amplifier circuit may further comprise a saturation detection block configured to: detect if the protection circuit is in the clamping status; and if the protection circuit is in the clamping status, activate the recovery circuit, and if the circuit is not in the clamping status, disable the recovery circuit.

In one example, the amplifier circuit may further comprise a current sense block configured to provide the amplifier circuit with a load bias current.

According to another embodiment, there is provided a radio frequency module comprising: an amplifier circuit having: a power amplifier configured to provide a radio frequency signal; a protection circuit configured to detect an overdrive condition and, in response to detecting an overdrive condition, apply a clamping status to the protection circuit to reduce a bias current to the power amplifier, the protection circuit having a capacitor and a recovery circuit including: a sensing component configured to monitor a change of charging and discharging currents to and from the capacitor respectively during the clamping status; a first device configured to set the time constant of the recovery circuit; and a second device configured to reset the protection circuit and remove the clamping status when the change of charging or discharging current is beyond a predetermined threshold; and the radio frequency module further comprising a filter configured to filter the radio frequency signal.

According to another embodiment, there is provided a wireless communication device comprising an amplifier circuit having: a power amplifier configured to provide a radio frequency signal; a protection circuit configured to detect an overdrive condition and, in response to detecting an overdrive condition, apply a clamping status to the protection circuit to reduce a bias current to the power amplifier, the protection circuit having a capacitor and a recovery circuit including: a sensing component configured to monitor a change of charging and discharging currents to and from the capacitor respectively during the clamping status; a first device configured to set the time constant of the recovery circuit; and a second device configured to reset the protection circuit and remove the clamping status when the change of charging or discharging current is beyond a predetermined threshold.

According to another embodiment, there is provided a method of protecting an amplifier circuit, the method comprising: detecting, by a protection circuit coupled to a power amplifier, an overdrive condition; in response to detecting an overdrive condition, applying a clamping status to the protection circuit to reduce a bias current to the power amplifier; sensing, by a sensing component of a recovery circuit, a change of charging and discharging currents to and from a capacitor respectively during the clamping status; and resetting, by a second device of the recovery circuit, the protection circuit to remove the clamping status when the change of charging or discharging currents is beyond a predetermined threshold, the recovery circuit also comprising a first device configured to set a time constant of the recovery circuit.

In one example, the method may further comprise charging the capacitor when a load bias sensing current is above a predetermined threshold, indicating the overdrive condition.

In one example, the method may further comprise a transconductance device driven by a voltage over the capacitor reducing the bias current to the power amplifier during the clamping status.

In one example, the method may further comprise the sensing component monitoring the change of charging and discharging currents to and from the capacitor respectively by observing a voltage drop across sensing terminals of the sensing component.

In one example, the sensing component may be a resistor.

In one example, the method may further comprise: detecting, by a saturation detection block, if the protection circuit is in the clamping status; and if the protection circuit is in the clamping status, activating the recovery circuit, and if the circuit is not in the clamping status, disabling the recovery circuit.

In one example, the method may further comprising providing, by a current sense block, a load bias current to the amplifier circuit.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to an amplifier circuit having an overdrive protection circuit, which also advantageously includes a fast recovery circuit. When the circuit is clamped to protect, for example, a filter device from an overdrive event, the fast recovery circuit allows a subsequent power drop to be detected and the circuit to be reset quickly. The inclusion of the fast recovery circuit with the protection circuit allows the amplifier circuit to be implemented as a single piece of hardware, saving both cost and physical area occupied by the circuit when compared with existing arrangements.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Embodiments of the present disclosure implement a fast recovery circuit in the form of power drop detection circuitry to detect any power drop events during a clamping status (also referred to herein as a clamping mode) of an amplifier circuit. Detection of a power drop beyond a threshold can trigger a reset of the overdrive protection loop and hence resume normal operation of the amplifier. Embodiments of the present disclosure achieve fast recovery of the large time constant loop of the protection circuitry using simpler, cheaper, and more efficient circuitry than existing solutions. Advantageously, fast recovery can be performed for any power drop event regardless of being trigger by bias or gain change, or input power drop.

Figure 1:
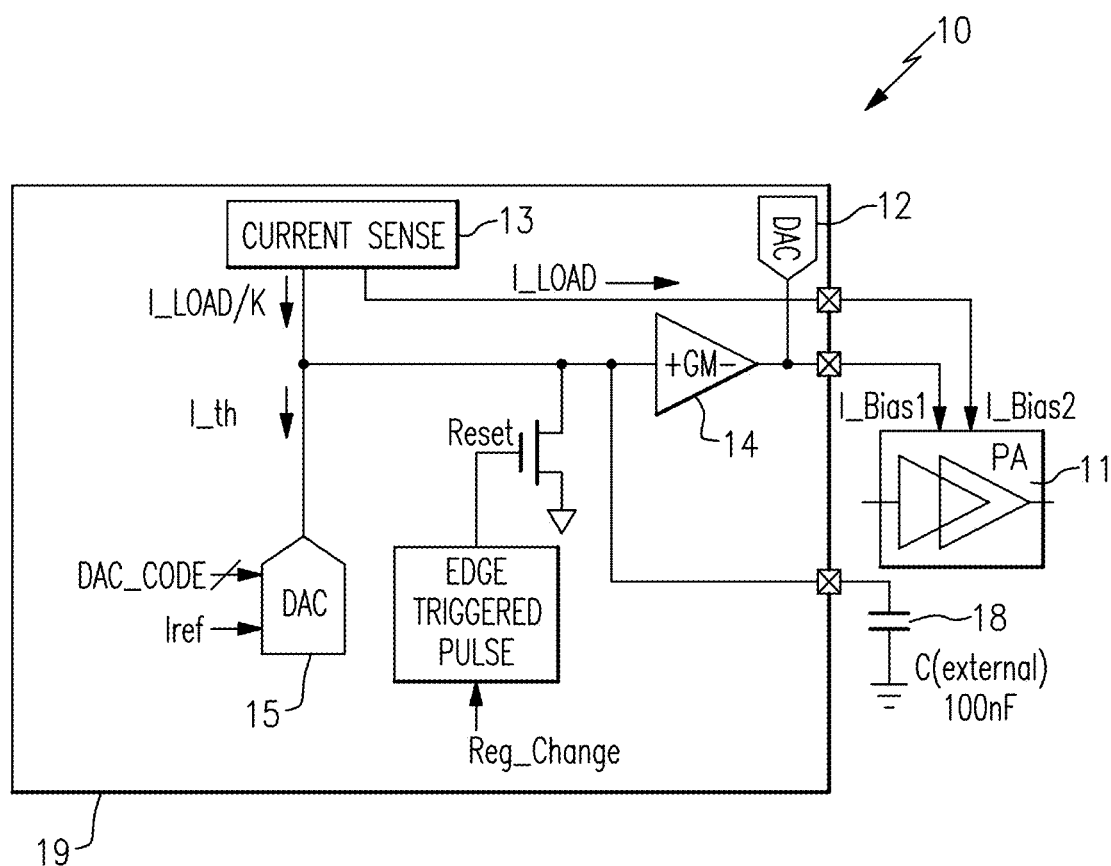
FIG. 1 is a schematic diagram illustrating an amplifier circuit according to the prior art.

For example, FIG. 1 illustrates an example amplifier circuit 10 implementing an overdrive protection loop 19. A current sense block 13 provides a load bias current I_LOAD for the power amplifier 11, and also outputs a duplicate current as a sensing current I_LOAD/K. The average of I_LOAD indicates the average output power of the power amplifier 11. A threshold current I_th is set by a digital-to-analogue converter (DAC) 15. The threshold current corresponds to an output power threshold indicating an overdrive condition.

When the sensing current I_LOAD/K is larger than the threshold current I_th, an external capacitor 18 is charged by the difference between the sensing current and the current threshold. The external capacitor is typically large, and the time constant of the protection loop 19 is large in order to detect average power to the power amplifier 11, rather than instantaneous power.

A transconductance block 14 is driven by the voltage over the large external capacitor 18. A digital-to-analogue converter (DAC) 12 provides current to bias the power amplifier 11, the gain of the power amplifier 11 being controlled by the bias current. When the capacitor is charged by excess current indicating an overdrive condition, the transconductance block 14 is driven by voltage over the capacitor 18 which acts to reduce or cancel the bias current from the DAC 12. When I_LOAD/K is smaller than the threshold current, the voltage over the external capacitor 18 is small and the transconductance block 14 outputs no current. When I_LOAD/K becomes larger than the threshold current, the transconductance block 14 reduces the net bias current to the power amplifier 11, which in turn reduces the output power of the power amplifier 11. The I_LOAD/K exceeding the current threshold indicates an overdrive condition, and the reduction in output power of the amplifier 11 can be considered a clamping status (or entry into a clamping mode) of the protection circuit.

This overdrive protection loop suffers from sluggish recovery when a power drop event occurs during the clamping status or mode because the threshold current is too small to discharge the large capacitor 18 quickly. Therefore, the effective gain of the power amplifier 11 is kept small for a long time.

Therefore, if there comes an input power drop event after the protection loop is already clamping the output power, the system needs to be settled to the new power quickly, for example within hundreds of microseconds.

Power drop events can be triggered by some corresponding mobile industry processor interface (MIPI) register updates, such as PA bias control, band switch, mode switch etc. For these cases, the register-updated information can be used to reset the loop immediately. This may be done by a control signal at block 16 of FIG. 1. However, the power drop events are more often due to input radio frequency (RF) power drop, with no digital control signals being sent to RF front end module. In such a situation, the immediate reset is not possible.

Another existing method involves duplicating the slow overdrive protection loop with a faster loop. In this way, the faster loop can respond to the power drop events more abruptly and generate the reset signal for the slow loop. However, there are several drawbacks of this method. Firstly, there will be mismatch between the two loops due to circuit mismatches, so it's very difficult to get an accurate power drop threshold. Secondly, the faster loop needs a very large on-chip capacitor or an external capacitor to duplicate the large external capacitor of the slow loop, which increases the cost.

Figure 2:
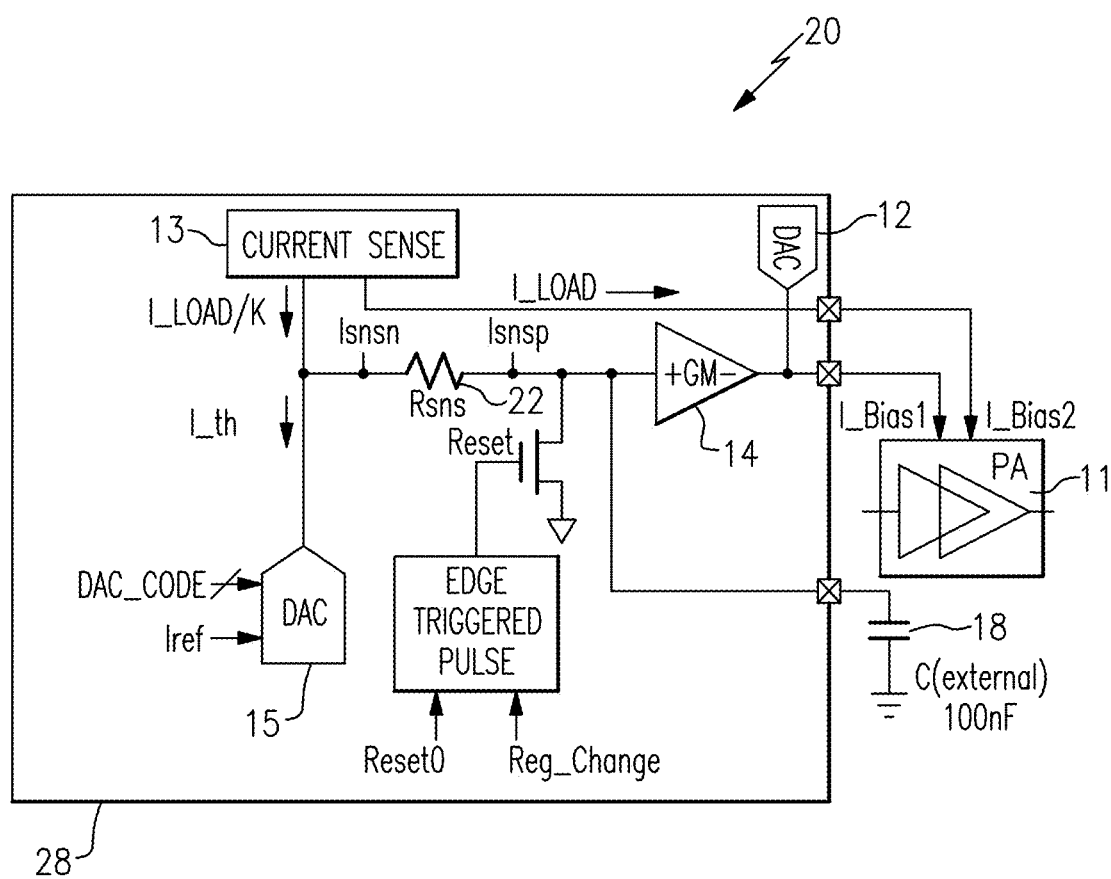
FIG. 2 is a schematic diagram illustrating an amplifier circuit according to aspects of the present disclosure.

FIG. 2 illustrates an example amplifier circuit 20 according to some embodiments. FIG. 2 is similar to the arrangement of FIG. 1 in some respects. For example, the amplifier circuit 20 similarly comprises a current sense block 13 providing a load bias current I_LOAD for the power amplifier 11, as well as a duplicate sensing current I_LOAD/K. The average of I_LOAD indicates the average output power of the power amplifier 11. A threshold current I_th is set by a digital-to-analogue converter (DAC) 15. The threshold current corresponds to an output power threshold indicating an overdrive condition.

The amplifier circuit 20 implements a protection loop 28. The protection circuit is configured to detect an overdrive condition. For example, when the sensing current I_LOAD/K is larger than the threshold current I_th, a capacitor 18, which may be an external capacitor, is charged by the difference between the sensing current and the current threshold. When the current exceeds the threshold current, an overdrive condition has been detected. The external capacitor is large, for example 100 nF, and the time constant of the protection loop 28 is large in order to detect average power to the power amplifier 11, rather than instantaneous power.

Similarly to the arrangement of FIG. 1, a transconductance block 14 is driven by the voltage over the large external capacitor 18. A digital-to-analogue converter (DAC) 12 provides current to bias the power amplifier 11. When the capacitor is charged by excess current indicating an overdrive condition, the transconductance block 14 is driven by voltage over the capacitor 18 which acts to reduce or cancel the bias current from the DAC 12. When I_LOAD/K is smaller than the threshold current, the voltage over the external capacitor 18 is small and the transconductance block 14 outputs no current. When I_LOAD/K becomes larger than the threshold current, the transconductance block 14 reduces the net bias current to the power amplifier 11, which in turn reduces the gain and hence output power of the power amplifier 11. The I_LOAD/K exceeding the current threshold indicates an overdrive condition, and the reduction in output power of the amplifier 11 can be considered a clamping status (or entry into a clamping mode or state). In other words, the protection circuit is configured to detect an overdrive condition, and in response to detecting an overdrive condition, apply a clamping status to reduce the bias current to the power amplifier in order to prevent damage to the device.

Significantly, however, the protection circuit 28 also comprises a recovery circuit or fast recovery circuit. Broadly, the fast recovery circuit is implemented to provide a faster time constant circuit such that, in the event of a power drop during clamping of the bias current to the power amplifier, the circuit can quickly recover and resume normal operation of the amplifier. Preferably, the system is settled to the new power and normal operation of the power amplifier 11 is resumed within the order of 100 s of microseconds.

The recovery circuit comprises a capacitor and a sensing component configured to monitor a change of charging and discharging currents to and from the capacitor respectively during the clamping status. That is, currents may charge or discharge the capacitor in the recovery circuit, and the sensing component is configured to monitor or sense both charging and discharging currents. In this embodiment, the sensing component is a sensing resistor 22. The sensing resistor 22 is configured to monitor a change of charging or discharging currents to and from the external capacitor respectively by observing the voltage drop across sensing terminals of the sensing resistor. In other words, during clamping status, the DC component of the voltage across the sensing resistor 22 will be approximately 0V due to the entire loop having a steady voltage while clamped, with the current charging the capacitor and the current being discharged from the capacitor being approximately balanced. If a power drop event occurs, the discharge current from the capacitor 18 will be larger than the charge current, and thus the DC component of the voltage will be positive. By monitoring the change of charging/discharging currents, the sensing resistor 22 can determine if a power drop occurs during clamping of the circuit.

The recovery circuit also comprises a first device configured to set a time constant of the recovery circuit. In this embodiment, the first device is a filter and particularly a low-pass filter, illustrated in more detail in FIGS. 3 and 4 described below. The recovery circuit also comprises a second device configured to reset the amplifier circuit to end the clamping status when the change of charging/discharging current is beyond a predetermined threshold. For example, the second device may be configured to end the clamping status when it is determined that a discharge current increases beyond a predetermined threshold, or the charging current drops beyond a predetermined threshold, or in other words, that a power drop beyond a predetermined threshold has occurred. In this embodiment, the third device is a comparator device, illustrated more in FIGS. 3 and 5 described below. As explained in more detail below, the low-pass filter is configured to filter the voltage across the sensing resistor 22. The comparator then detects the output low frequency voltage from the low-pass filter. The comparator can then issue a reset signal at edge trigger block 26, removing or ending the clamping status from the protection circuit when the change of discharging currents is beyond a predetermined threshold, allowing the power amplifier to return to normal operation quickly whilst avoiding damage to components. Conveniently, edge trigger block 26 is configured to receive digital signals, so may also receive a reset signal in the form of a register change command signal, for example corresponding to a mobile industry processor interface (MIPI) register update.

Advantageously, the protection circuit including the recovery circuit can be implemented as a single piece of hardware. This convenient combining of a protection circuit having a large (slow) time constant and the recovery circuit having a smaller (fast) time constant allows savings on cost, components, and physical area occupied by the circuitry, whilst providing the fast recovery from a power drop event during a clamping status of the protection circuit.

The amplifier circuit according to one or more embodiments described can meet the interloop power control (ILPC) requirements of having 1 dB drop accuracy during operation. In other words, when in operation at high power and the protection loop responds by clamping to limit the output power, as input power drops, the current falls below the threshold and gain starts to recover. This recovery should preferably meet ILPC requirements. The protection loop detects whether power is reducing or recovering by the current forming across the resistor, allowing the circuit to eliminate unnecessary bias pullback and avoid an unnecessary drop of output power. In some applications, this must be within 1 dB of accuracy. The average power of typical devices implementing such amplifier circuits may be between 25 and 28 dBm. A typical mobile wireless device may output 23 dBm, with 2 dBm insertion loss in a path between the power amplifier and an antenna, the power amplifier therefore outputting approximately 25 dBm. The sensing resistor must therefore be able to detect a drop of the order of 1 dB in some applications.

Figure 3:
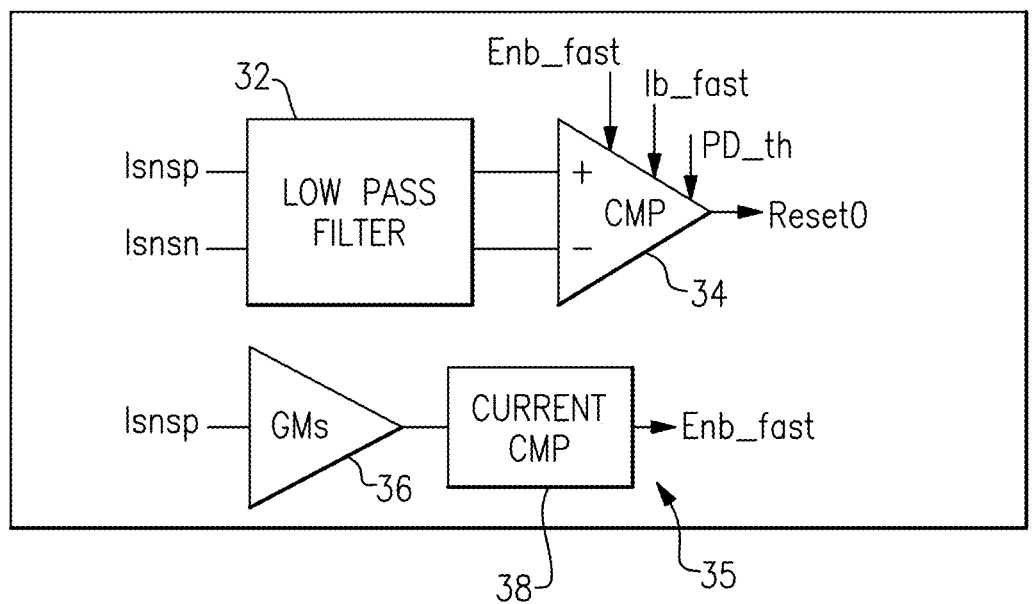
FIG. 3 is a schematic diagram of a filter device, a comparator device, and a saturation detection block according to aspects of the present disclosure.
Figure 4:
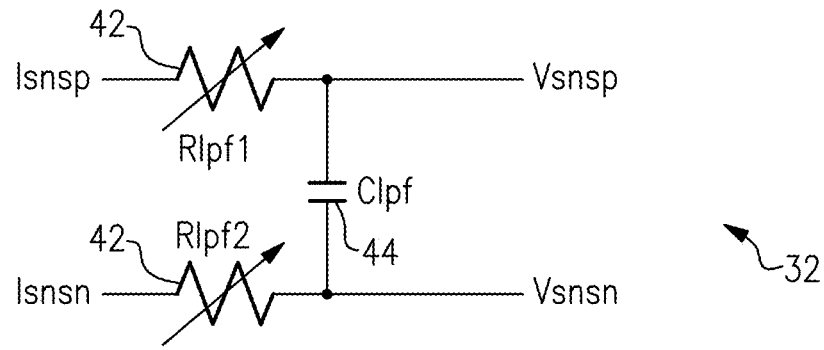
FIG. 4 is a schematic diagram of a filter device according to aspects of the present disclosure.

FIG. 3 illustrates a low-pass filter device 32 and a comparator device 34. The low-pass filter 32 receives the positive and negative sensing current inputs across the sensing resistor 22. As illustrated in more detail in FIG. 4, the filter device 32 comprises resistors 42, coupled in parallel by a capacitor 44. The filter device 32 has a proper corner frequency and filters the voltage (V(Isnsp Isnsn)) across the sensing resistor 22. By using a low-pass filter, the DC component of the voltage can be extracted without large high frequency components which are related to the modulated signal of the power amplifier 11. The area and/or sizes of the resistors 42 and capacitor 44 can be optimized for a desired corner frequency.

The comparator device 34 detects a low-frequency voltage output from the low-pass filter. The comparator device 34 compares the voltage signals corresponding to the sensing resistor 22, and if there is a difference beyond a predetermined threshold, a reset signal can be provided to the edge trigger block 26 to reset the protection circuit and end or remove the clamping status. The transconductance block 14 then no longer acts to reduce or remove the bias current biasing the power amplifier 11.

In this embodiment, the comparator device 34 is an adaptive threshold comparator device. That is, the threshold can be dynamically controlled to track the power threshold of the protection loop, so the threshold of the power drop (for example, in dB) can be set.

Figure 5:
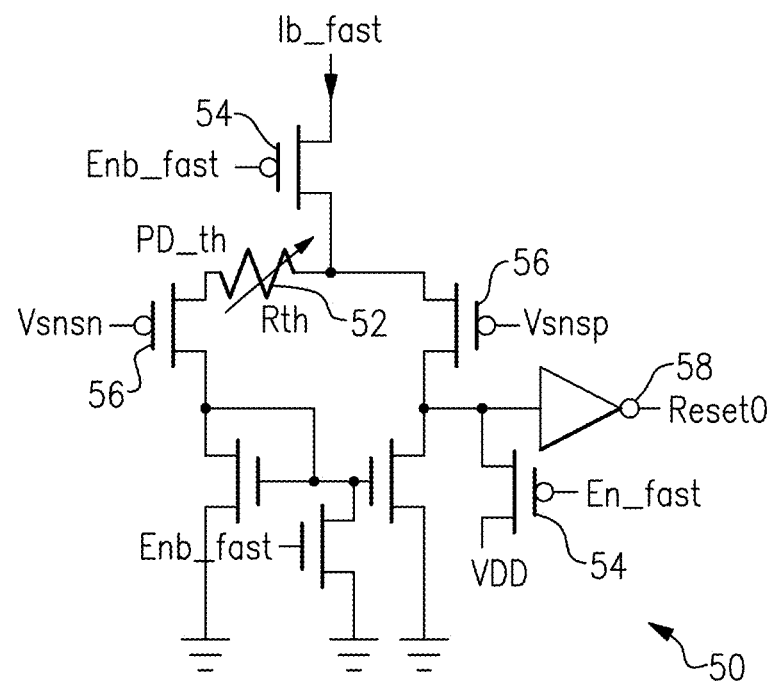
FIG. 5 is a schematic diagram of a comparator device according to aspects of the present disclosure.

Such a comparator is illustrated in more detail in FIG. 5. The comparator device 50 comprises inputs 56 for the positive and negative components of the voltage to be compared. The device 50 also comprises an output 58 to output a reset signal to the edge trigger block 26 to reset the protection circuit 28 and remove the clamping status.

The threshold of the comparator is set by 0.5*Ib_fast*Rth, where Ib_fast is the current biasing the fast recovery circuit, and Rth is a resistance set by a threshold resistor 52. The threshold of the power drop event can therefore be derived as Equation 1 below.

$$\frac{P_{drop}}{P_{th}} = \frac{I_{drop}}{I_{th}} = \frac{0.5 * Ib_{fast} * Rth}{I_{th} * Rsns} \qquad \text{Equation 1}$$

Where P_drop is the drop in power corresponding to the drop in current I_drop during a power drop, and P_th is the threshold power corresponding to the current threshold I_th. The resistance Rth should preferably match the resistance of the sensing resistor to avoid side effects of process variation. Ib_fast can be set to track the current from the DAC 15 in order to achieve an adaptive threshold that is independent of a power threshold Pth.

FIG. 3 also illustrates a saturation detection block 35. In some embodiments, the amplifier circuit 20 includes a saturation detection block 35 to detect if the overdrive protection loop 28 is in clamping status or in a standby status (meaning the loop is not in clamping status). If the loop is in clamping status, the fast recovery circuit can be activated to monitor the power drop events. If the loop is in standby status, the fast recovery circuit can be disabled to save power consumption.

The saturation detection block 35 comprises a transconductance block 36 which duplicates the transconductance block 14 of the amplifier circuit 20. The saturation block also comprises a current comparator to determine if the transconductance block 36 is active. In other words, the saturation block is configured to detect if the circuit is in the clamping status by determining if the transconductance block 36 (duplicating transconductance block 14) is active. If it is determined that the transconductance block 36 is active, the protection circuit 28 is in clamping status. If it is determined that the transconductance block 36 is not active, the protection circuit 28 is in standby status, or not in clamping status. If it is determined that the protection circuit is in clamping status, the fast recovery circuit may be activated at least in part by providing an enabling signal Enb_fast to inputs 54 of the comparator device 50.

Figure 6:
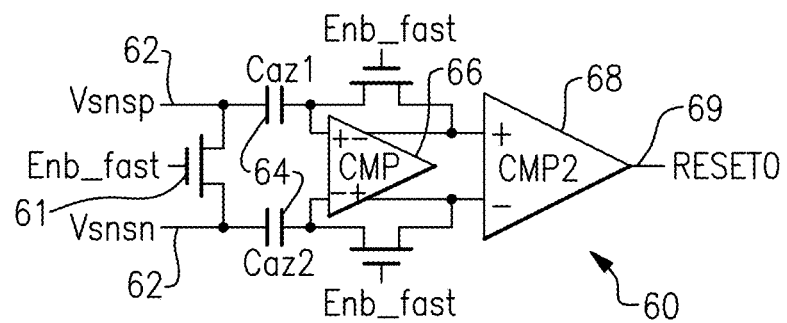
FIG. 6 is a schematic diagram of a comparator device according to aspects of the present disclosure.

FIG. 6 illustrates a comparator device 60 according to some embodiments. In this embodiment, the comparator device is an auto-zeroing comparator device configured to receive an auto-zeroing signal. In some devices, the voltages can be very small. It can therefore be advantageous to increase the sensitivity of the comparator. That is, the minimum signal the comparator can detect may be reduced. Auto-zeroing can be used to increase the resolution of the comparator and detect very small delta (changes) in signal. A status signal Enb_fast may be received at an input 61 from the saturation detection block 35, which in addition to enabling the fast recovery circuit when in clamping status, can also be used as an auto-zeroing control signal to achieve the low offset comparator. The accuracy of the threshold of the power drop event can thus be improved.

The auto-zeroing comparator device 60 comprises inputs 62 for the positive and negative components of the sensing voltages filtered by the filter device, and capacitors 64. The comparator device 60 also comprises a first comparator 66 and a second comparator 68. The second comparator 68 comprises an output 69 to output the reset signal if it is determined that a reset of the protection circuit 28 is required.

Figure 7:
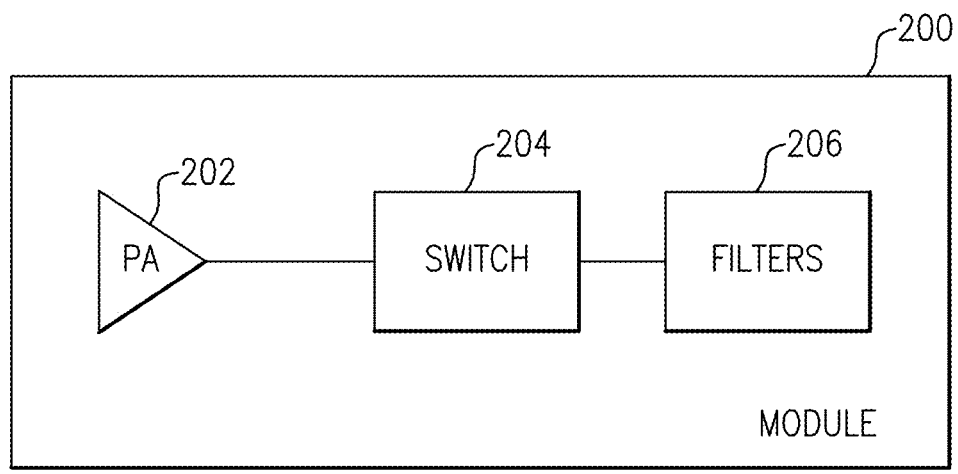
FIG. 7 is a schematic block diagram of a module that includes a power amplifier circuit according to aspects of the present disclosure, a switch, and filters.

FIG. 7 is a schematic block diagram of a module 200 such as a radio frequency module that includes a power amplifier 202 including the amplifier circuit 20 in accordance with one or more embodiments described herein, a switch 204, and filters 206. The amplifier circuit 20 according to one or more embodiments described herein and having one or more associated advantages as described herein provides overdrive protection to the switch 204 and filters 206, whilst allowing fast recovery if a power drop event occurs during clamping of the protection circuit in the amplifier circuit 20. The module 200 can include a package that encloses the illustrated elements. The power amplifier 202, the switch 204, and the filters 206 can be disposed on a common packaging substrate. The packaging substrate can be a laminate substrate, for example. The power amplifier 202 can amplify a radio frequency signal. The power amplifier 202 can include a gallium arsenide bipolar transistor in certain applications. The switch 204 can be a multi-throw radio frequency switch. The switch 204 can electrically couple an output of the power amplifier 202 to a selected filter of the filters 206. The filters 206 can include any suitable number of surface acoustic wave filters and/or other acoustic wave filters. One or more of the surface acoustic wave filters of the filters 206 can be implemented in accordance with any suitable principles.

Figure 8:
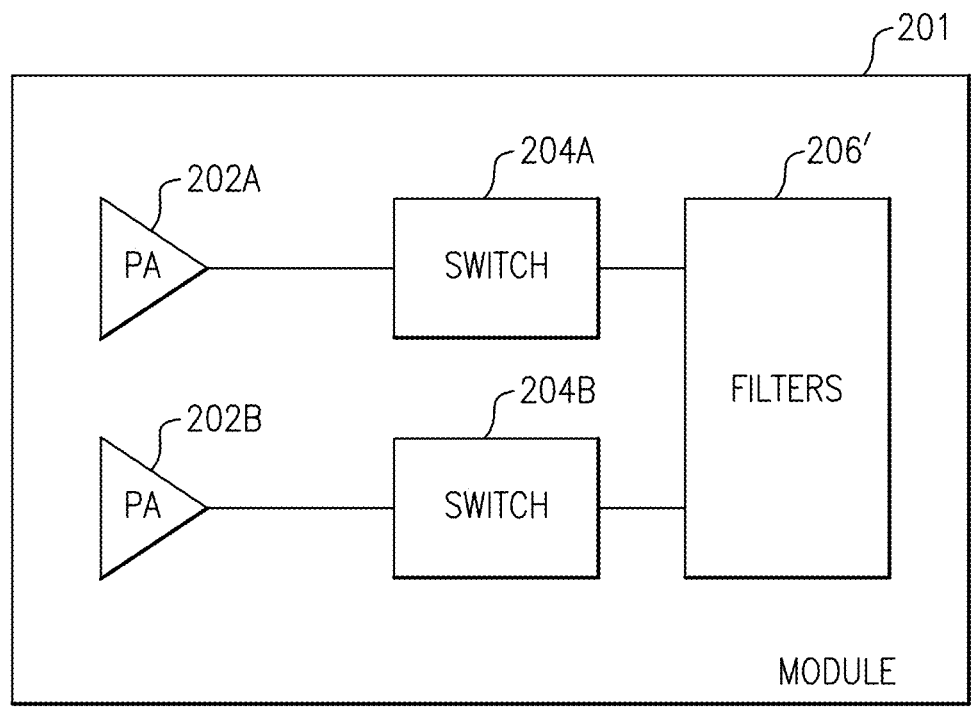
FIG. 8 is a schematic block diagram of a module that includes power amplifier circuits according to aspects of the present disclosure, switches, and filters.

FIG. 8 is a schematic block diagram of a module 201 such as a radio frequency module that includes power amplifiers 202A and 202B, one or both of the power amplifiers including an amplifier circuit in accordance with one or more embodiments described herein, switches 204A and 204B, and filters 206'. The module 201 is like the module 200 of FIG. 7, except that the module 201 includes an additional power amplifier 202B and an additional switch 204B and the filters 206' are arranged to filter signals for the signals paths associated with a plurality of power amplifiers 202A and 202B. The different signal paths can be associated with different frequency bands and/or different modes of operation (e.g. different power modes, different signaling modes, etc.).

Figure 9:
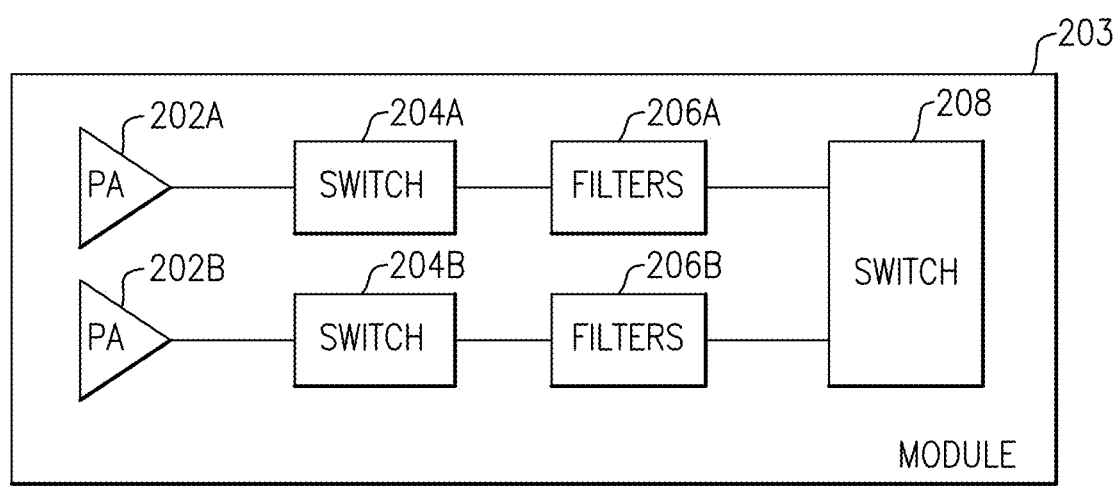
FIG. 9 is a schematic block diagram of a module that includes power amplifiers according to aspects of the present disclosure, switches, and filters.

FIG. 9 is a schematic block diagram of a module 203 such as a radio frequency module that includes power amplifiers 202A and 202B, one or both of the power amplifiers including an amplifier circuit in accordance with one or more embodiments described herein, more switches 204A and 204B, filters 206A and 206B, and an antenna switch 208. The module 203 is like the module 201 of FIG. 7, except the module 203 includes an antenna switch 208 arranged to selectively couple a signal from the filters 206A or the filters 206B to an antenna node. The filters 206A and 206B can correspond to the filters 206' of FIG. 7.

Figure 10:
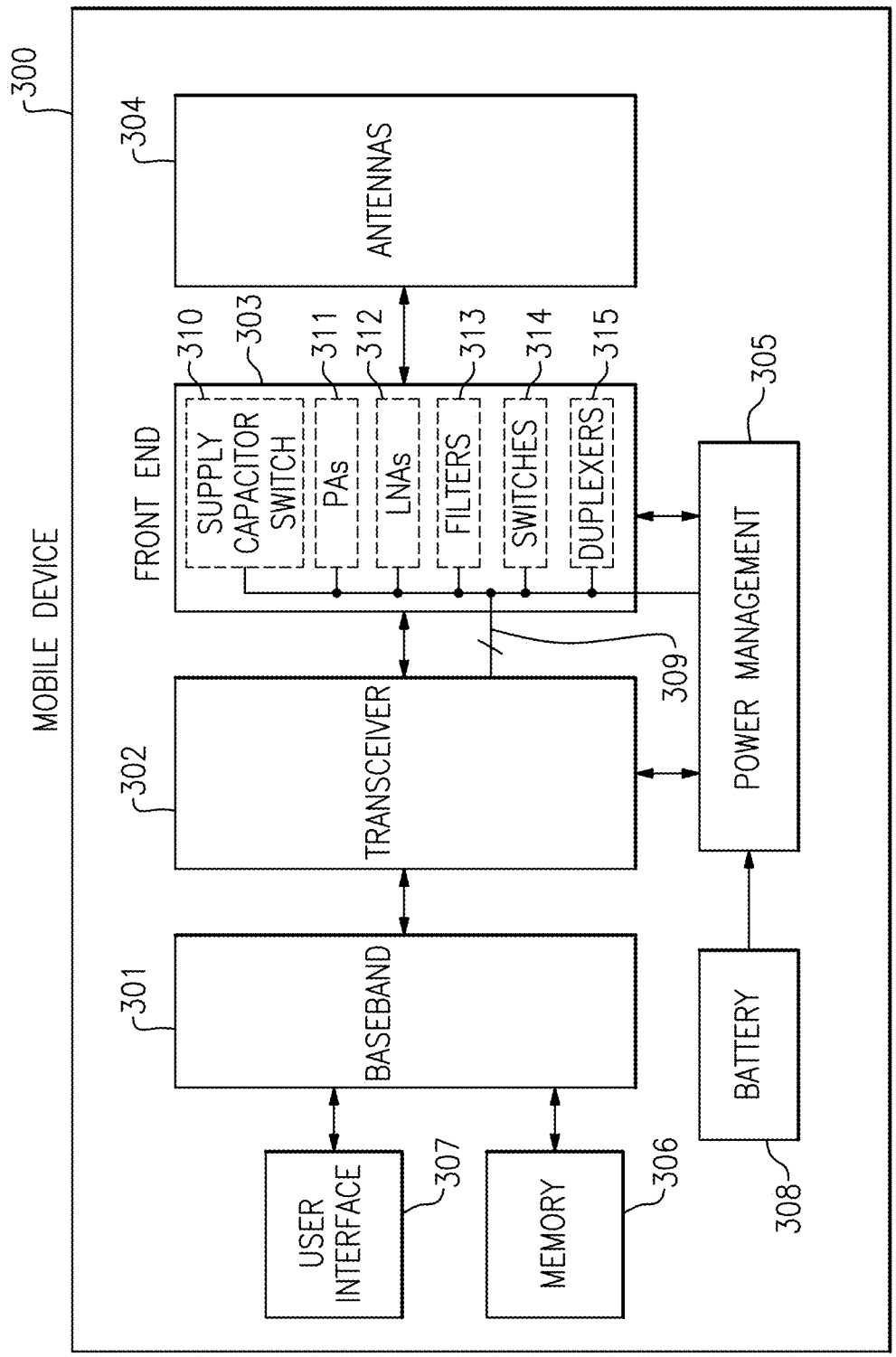
FIG. 10 is a schematic diagram of one embodiment of a wireless communication device.

FIG. 10 is a schematic diagram of one embodiment of a wireless communication device such as a mobile device 300. The mobile device 300 includes a baseband system 301, a transceiver 302, a front end system 303, antennas 304, a power management system 305, a memory 306, a user interface 307, and a battery 308.

Although the mobile device 300 illustrates one example of an RF system that can include one or more features of the present disclosure, the teachings herein are applicable to electronic systems implemented in a wide variety of ways.

The mobile device 300 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 302 generates RF signals for transmission and processes incoming RF signals received from the antennas 304. It will be understood that various functionalities associated with the transmission and receiving of RF signals can be achieved by one or more components that are collectively represented in FIG. 10 as the transceiver 302. In one example, separate components (for instance, separate circuits or dies) can be provided for handling certain types of RF signals.

As shown in in FIG. 10, the transceiver 302 is connected to the front end system 303 and to the power management circuit 305 using a serial interface 309. All or part of the illustrated RF components can be controlled by the serial interface 309 to configure the mobile device 300 during initialization and/or while fully operational. In another embodiment, the baseband processor 301 is additionally or alternative connected to the serial interface 309 and operates to configure one or more RF components, such as components of the front end system 303 and/or power management system 305.

The front end system 303 aids in conditioning signals transmitted to and/or received from the antennas 304. In the illustrated embodiment, the front end system 303 includes one or more bias control circuits 310 for controlling power amplifier biasing, one or more power amplifiers (PAs) 311 including one or more amplifier circuits in accordance with one or more embodiments described herein, one or more low noise amplifiers (LNAs) 312, one or more filters 313, one or more switches 314, and one or more duplexers 315. However, other implementations are possible.

For example, the front end system 303 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 300 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 304 can include antennas used for a wide variety of types of communications. For example, the antennas 304 can include antennas for transmitting and/or receiving signals associated with a wide variety of frequencies and communications standards.

In certain implementations, the antennas 304 support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 300 can operate with beamforming in certain implementations. For example, the front end system 303 can include phase shifters having variable phase controlled by the transceiver 302. Additionally, the phase shifters are controlled to provide beam formation and directivity for transmission and/or reception of signals using the antennas 304. For example, in the context of signal transmission, the phases of the transmit signals provided to the antennas 304 are controlled such that radiated signals from the antennas 304 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 304 from a particular direction. In certain implementations, the antennas 304 include one or more arrays of antenna elements to enhance beamforming.

The baseband system 301 is coupled to the user interface 307 to facilitate processing of various user input and output (I/O), such as voice and data. The baseband system 301 provides the transceiver 302 with digital representations of transmit signals, which the transceiver 302 processes to generate RF signals for transmission. The baseband system 301 also processes digital representations of received signals provided by the transceiver 302. As shown in FIG. 10, the baseband system 301 is coupled to the memory 306 to facilitate operation of the mobile device 300.

The memory 306 can be used for a wide variety of purposes, such as storing data and/or instructions to facilitate the operation of the mobile device 300 and/or to provide storage of user information.

The power management system 305 provides a number of power management functions of the mobile device 300. In certain implementations, the power management system 305 includes a power amplifier (PA) supply control circuit that controls the supply voltages of the power amplifiers 311. For example, the power management system 305 can be configured to change the supply voltage(s) provided to one or more of the power amplifiers 311 to improve efficiency, such as power added efficiency (PAE).

The power management system 305 can operate in a selectable supply control mode, such an average power tracking (APT) mode or an envelope tracking (ET) mode. In the illustrated embodiment, the selected supply control mode of the power management system 305 is controlled by the transceiver 302. In certain implementations, the transceiver 302 controls the selected supply control mode using the serial interface 309.

As shown in FIG. 10, the power management system 305 receives a battery voltage from the battery 308. The battery 308 can be any suitable battery for use in the mobile device 300, including, for example, a lithium-ion battery. Although the power management system 305 is illustrated as separate from the front end system 303, in certain implementations all or part (for instance, a PA supply control circuit) of the power management system 305 is integrated into the front end system 303.

Figure 11:
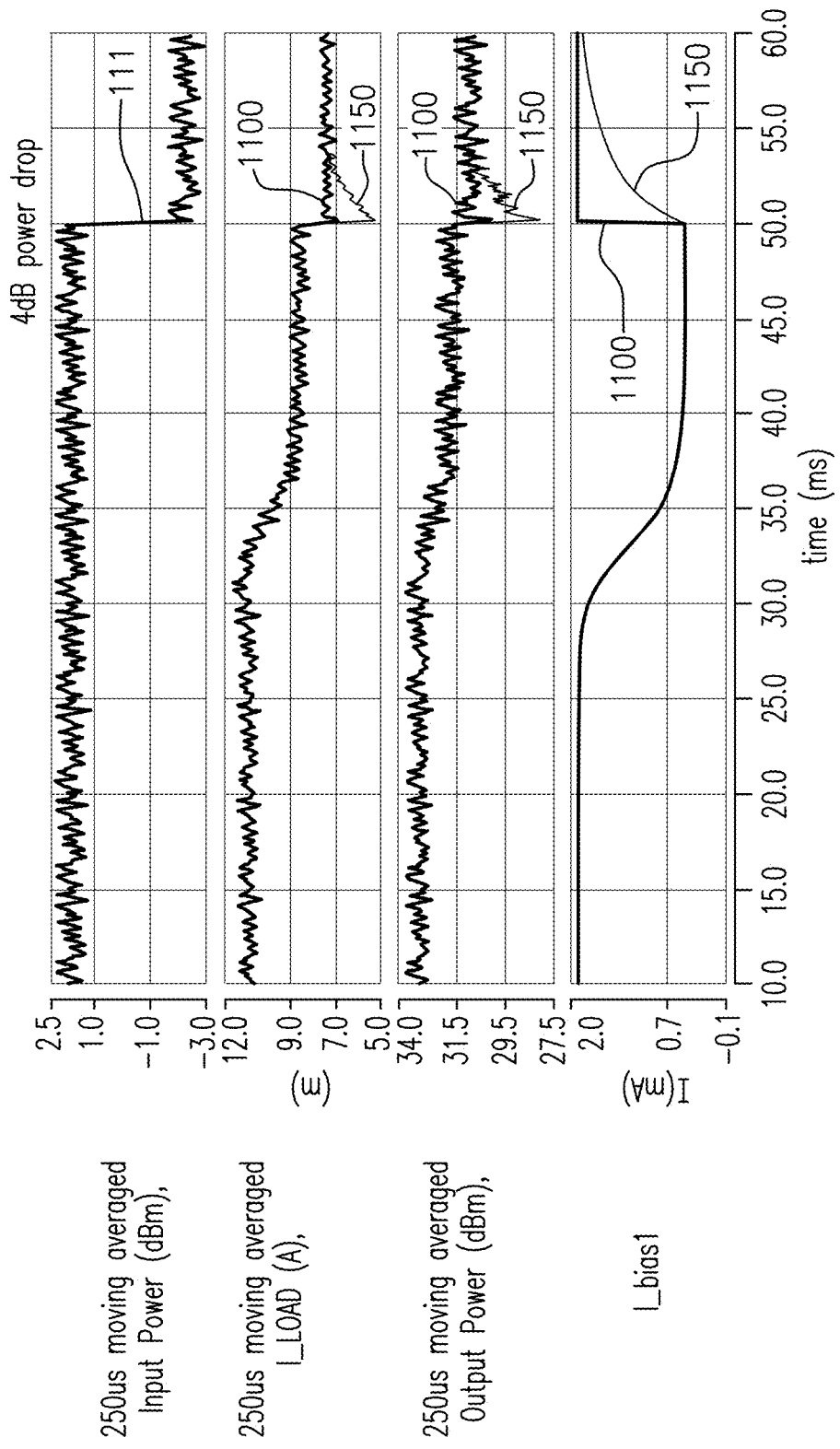
FIG. 11 is a graph illustrating a comparison of performance between a conventional circuit and an amplifier circuit according to aspects of the present disclosure.

FIG. 11 is a graph illustrating a comparison of performance for recovery following a power drop event during a clamping status between an existing, conventional arrangement, and an arrangement including an amplifier circuit in accordance with one or more embodiments described herein.

An example existing amplifier circuit and an example amplifier circuit according to one or more embodiments described herein experience a power drop of 4 dB illustrated by the moving averaged input power 111. Following the power drop, the fast recovering amplifier circuit 1100 according to aspects of the present disclosure demonstrates improved efficiency in relation to a moving averaged load bias current I_LOAD and moving averaged output power when compared to the existing amplifier circuit performance 1150. In addition, significantly, the bias current to the power amplifier I_bias1 which is reduced during the clamping status is recovered significantly quicker in the amplifier circuit 1100 according to one or more embodiments described herein, when compared with the sluggish, inefficient recovery of an existing amplifier circuit 1150.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. An amplifier circuit comprising:
   a power amplifier; and
   a protection circuit coupled to the power amplifier, the protection circuit being configured to detect an overdrive condition and, in response to detecting an overdrive condition, apply a clamping status to the protection circuit to reduce a bias current to the power amplifier, the protection circuit having a capacitor and a recovery circuit including a sensing component configured to monitor a change of charging and discharging currents to and from the capacitor respectively during the clamping status, the capacitor and the recovery circuit further including a first device configured to set a time constant of the recovery circuit and a second device configured to reset the protection circuit to remove the clamping status when the change of charging or discharging current is beyond a predetermined threshold.

2. The amplifier circuit of claim 1 wherein the capacitor is configured to charge when a load bias sensing current is above a predetermined threshold, indicating the overdrive condition.

3. The amplifier circuit of claim 2 wherein the protection circuit further includes a transconductance device driven by a voltage over the capacitor and being configured to reduce the bias current to the power amplifier during the clamping status.

4. The amplifier circuit of claim 2 wherein the sensing component is configured to monitor the charging and discharging currents to and from the capacitor respectively by observing a voltage drop across sensing terminals of the sensing component.

5. The amplifier circuit of claim 1 wherein the sensing component is a resistor.

6. The amplifier circuit of claim 1 wherein the first device is a filter device configured to filter a voltage across the sensing component.

7. The amplifier circuit according to claim 1 wherein the second device is a comparator device.

8. The amplifier circuit according to claim 7 wherein the comparator device is an adaptive threshold comparator device.

9. The amplifier circuit according to claim 7 wherein the comparator device is configured to receive an auto-zeroing control signal.

10. The amplifier circuit according to claim 1 further comprising a saturation detection block configured to:
  detect if the protection circuit is in the clamping status; and
  if the protection circuit is in the clamping status, activate the recovery circuit, and if the protection circuit is not in the clamping status, disable the recovery circuit.

11. The amplifier circuit according to claim 1 further comprising a current sense block configured to provide the amplifier circuit with a load bias current.

12. A radio frequency module comprising:
  an amplifier circuit having a power amplifier configured to provide a radio frequency signal and a protection circuit configured to detect an overdrive condition and, in response to detecting an overdrive condition, apply a clamping status to the protection circuit to reduce a bias current to the power amplifier, the protection circuit having a capacitor and a recovery circuit including a sensing component configured to monitor a change of charging and discharging currents to and from the capacitor respectively during the clamping status, the capacitor and the recovery circuit further including a first device configured to set a time constant of the recovery circuit and a second device configured to reset the protection circuit and remove the clamping status when the change of charging or discharging current is beyond a predetermined threshold; and
  a filter configured to filter the radio frequency signal.

13. A wireless communication device comprising the radio frequency module of claim 12.

14. A method of protecting an amplifier circuit, the method comprising:
  detecting, by a protection circuit coupled to a power amplifier, an overdrive condition;
  in response to detecting an overdrive condition, applying a clamping status to the protection circuit to reduce a bias current to the power amplifier;
  sensing, by a sensing component of a recovery circuit, a change of charging and discharging currents to and from a capacitor respectively during the clamping status; and
  resetting, by a second device of the recovery circuit, the protection circuit to remove the clamping status when the change of charging or discharging current is beyond a predetermined threshold, the recovery circuit also including a first device configured to set a time constant of the recovery circuit.

15. The method according to claim 14 wherein the method further comprises charging the capacitor when a load bias sensing current is above a predetermined threshold, indicating the overdrive condition.

16. The method according to claim 15 further comprising a transconductance device driven by a voltage over the capacitor reducing the bias current to the power amplifier during the clamping status.

17. The method according to claim 15 further comprising the sensing component monitoring the change of charging and discharging currents to and from the capacitor respectively by observing a voltage drop across sensing terminals of the sensing component.

18. The method according to claim 14 wherein the sensing component is a resistor.

19. The method according to claim 14 further comprising:
  detecting, by a saturation detection block, if the protection circuit is in the clamping status; and
  if the protection circuit is in the clamping status, activating the recovery circuit, and if the protection circuit is not in the clamping status, disabling the recovery circuit.

20. The method according to claim 14 further comprising providing, by a current sense block, a load bias current to the amplifier circuit.

* * * * *